(12) United States Patent
Kim et al.

(10) Patent No.: US 12,614,661 B2
(45) Date of Patent: Apr. 28, 2026

(54) TRANSFORMER AND FLAT PANEL DISPLAY DEVICE INCLUDING SAME

(71) Applicant: LG INNOTEK CO., LTD., Seoul (KR)

(72) Inventors: Yu Seon Kim, Seoul (KR); Seok Bae, Seoul (KR); In Seong Sohn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 864 days.

(21) Appl. No.: 17/759,898

(22) PCT Filed: Jan. 29, 2021

(86) PCT No.: PCT/KR2021/001240
§ 371 (c)(1),
(2) Date: Aug. 1, 2022

(87) PCT Pub. No.: WO2021/154048
PCT Pub. Date: Aug. 5, 2021

(65) Prior Publication Data
US 2023/0076761 A1     Mar. 9, 2023

(30) Foreign Application Priority Data

Jan. 31, 2020     (KR) ........................ 10-2020-0012155

(51) Int. Cl.
*H01F 27/28*         (2006.01)
*H01F 27/22*         (2006.01)
(Continued)

(52) U.S. Cl.
CPC ........... *H01F 27/306* (2013.01); *H01F 27/22* (2013.01); *H01F 27/263* (2013.01);
(Continued)

(58) Field of Classification Search
CPC ...... H01F 27/306; H01F 27/22; H01F 27/263; H01F 27/2871; H01F 27/2866;
(Continued)

(56) References Cited

U.S. PATENT DOCUMENTS

| | | | | |
|---|---|---|---|---|
| 5,331,536 A | * | 7/1994 | Lane | H01F 27/40 336/183 |
| 5,726,615 A | * | 3/1998 | Bloom | H01F 27/255 336/200 |

(Continued)

FOREIGN PATENT DOCUMENTS

| | | |
|---|---|---|
| CN | 101299549 A | 11/2008 |
| CN | 101740207 A | 6/2010 |

(Continued)

OTHER PUBLICATIONS

International Search Report dated May 4, 2021 in International Application No. PCT/KR2021/001240.

(Continued)

*Primary Examiner* — Mang Tin Bik Lian
(74) *Attorney, Agent, or Firm* — Saliwanchik, Lloyd & Eisenschenk

(57)          ABSTRACT

A transformer according to one embodiment comprises: a core portion having an upper core and a lower core; and a coil portion disposed in the core portion, wherein: the coil portion includes a first coil wound in a first direction, a second coil wound in a second direction opposite to the first direction, and a third coil including a flat panel shape; the lower core includes a body portion, a first leg portion and a second leg portion protruding from the body portion, and a spacing portion formed between the first leg portion and the second leg portion; the first leg portion includes two first outer legs and a first intermediate leg disposed between the two first outer legs; the second leg portion includes two second outer legs and a second intermediate leg disposed (Continued)

between the two second outer legs; the first coil can be disposed to surround the first intermediate leg; and the second coil can be disposed to surround the second intermediate leg.

14 Claims, 8 Drawing Sheets

(51) Int. Cl.

| | | |
|---|---|---|
| *H01F 27/26* | (2006.01) | |
| *H01F 27/30* | (2006.01) | |
| *H05K 5/00* | (2006.01) | |
| *H05K 5/02* | (2006.01) | |

(52) U.S. Cl.
CPC ....... *H01F 27/2871* (2013.01); *H05K 5/0018* (2022.08); *H05K 5/0247* (2013.01)

(58) Field of Classification Search
CPC . H01F 3/10; H01F 27/40; H01F 30/06; H01F 3/14; H01F 5/02; H01F 27/325; H01F 27/289; H01F 29/02
See application file for complete search history.

(56) References Cited

U.S. PATENT DOCUMENTS

| | | | | |
|---|---|---|---|---|
| 2004/0174241 | A1* | 9/2004 | He .................... | H01F 27/2804 |
| | | | | 336/200 |
| 2013/0057164 | A1* | 3/2013 | Gruber ............... | H01F 27/2804 |
| | | | | 336/182 |
| 2013/0099885 | A1* | 4/2013 | Park .................... | H01F 27/306 |
| | | | | 336/170 |
| 2013/0207766 | A1* | 8/2013 | Kim .................... | H01F 5/00 |
| | | | | 336/170 |
| 2016/0372250 | A1* | 12/2016 | Chida .................. | H01F 27/29 |
| 2018/0005748 | A1 | 1/2018 | Hozoji | |
| 2018/0197673 | A1* | 7/2018 | Njiende .............. | H01F 3/10 |
| 2020/0043648 | A1* | 2/2020 | Maruyama .......... | H01F 27/325 |
| 2020/0168389 | A1* | 5/2020 | Zhang ................. | H01F 27/324 |
| 2020/0203064 | A1* | 6/2020 | Sakamoto ........... | H01F 30/06 |
| 2022/0093325 | A1* | 3/2022 | Shi .................... | H02M 3/33592 |
| 2023/0197330 | A1* | 6/2023 | Ebner ................. | H01F 5/02 |
| | | | | 336/65 |

FOREIGN PATENT DOCUMENTS

| | | | |
|---|---|---|---|
| JP | 8-107023 | A | 4/1996 |
| JP | 2000-252139 | A | 9/2000 |
| JP | 2000-353628 | A | 12/2000 |
| JP | 2005-93493 | A | 4/2005 |
| KR | 10-1133584 | B1 | 4/2012 |
| KR | 10-1838225 | B1 | 3/2018 |
| KR | 10-1989172 | B1 | 6/2019 |
| KR | 10-2030570 | B1 | 10/2019 |

OTHER PUBLICATIONS

Office Action dated Sep. 3, 2024 in Japanese Application No. 2022-546660.
Office Action dated Aug. 12, 2024 in Korean Application No. 10-2020-0012155.
Notice of Allowance dated Feb. 3, 2026 in Chinese Application No. 202180026531.6.

* cited by examiner

TRANSFORMER AND FLAT PANEL DISPLAY DEVICE INCLUDING SAME

CROSS-REFERENCE TO RELATED APPLICATIONS

This application is the U.S. national stage application of International Patent Application No. PCT/KR2021/001240, filed Jan. 29, 2021, which claims the benefit under 35 U.S.C. § 119 of Korean Application No. 10-2020-0012155, filed Jan. 31, 2020, the disclosures of each of which are incorporated herein by reference in their entirety.

TECHNICAL FIELD

The present disclosure relates to a transformer and a flat panel display device including the same.

BACKGROUND ART

In general, driving power is required in order to drive an electronic device, and a power supply device, such as a power supply unit (PSU), is essentially used in order to supply driving power to the electronic device.

In particular, a display device, such as a flat panel TV, is required to be slim, and is continually being embodied in increasingly large sizes. Accordingly, it is necessary to reduce the thickness of such a large-scale display while meeting the increased power requirements thereof.

A transformer occupies a larger volume in the power supply unit (PSU) than other elements. Therefore, one of the most important issues for a slim device is to reduce the thickness of the transformer.

FIG. 1 is an exploded perspective view showing an example of the configuration of a general slim-type transformer.

Referring to FIG. 1, a general slim-type transformer 10 includes a secondary coil 13 and a primary coil 14, which are provided between an upper core 11 and a lower core 12. In general, the secondary coil 13 is composed of a plurality of conductive metal plates, and the primary coil 14 takes the form of a wound conductive wire. In another configuration, a bobbin (not shown) may be disposed between the upper core 11 and the lower core 12.

However, when the thickness of the transformer is reduced to a certain value (e.g. 11 mm) or less, there is a problem in that performance deteriorates significantly due to the characteristics of leakage inductance and parasitic capacitance. This will be described with reference to FIGS. 2A and 2B.

FIG. 2A shows the relationship between a change in the height of the slim-type transformer and leakage inductance, and FIG. 2B shows the relationship between a change in the distance between the primary coil and the secondary coil and parasitic capacitance.

First, referring to FIG. 2A, although there is a slight difference depending on the relative size of a gap formed between contact portions (generally, center legs) of the upper core 11 and the lower core 12, when the height of the transformer, for example, the distance from the upper surface of the upper core 11 to the lower surface of the lower core 12, is 13 mm or less, the leakage inductance becomes very low. Low leakage inductance is not preferable because performance fluctuates greatly depending on variation in load. The reason for this is that an LC resonant circuit constituted by the transformer in the power supply unit (PSU) operates in a relatively narrow band of operating frequencies, and accordingly, gain varies greatly depending on the amount of power that is used. In order to secure sufficient leakage inductance to inhibit problems caused by low leakage inductance, a method of additionally providing a separate inductor including a core and a coil may be proposed. The reason for this is that the LC resonant circuit is transformed into an LLC resonant circuit, in which an operating-frequency-dependent gain change is smaller than in the LC resonant circuit. However, additional provision of an inductor entails a problem in that a separate space in the power supply unit (PSU) in which to mount the inductor is needed.

In addition, referring to FIG. 2B, when the vertical distance between the primary coil 14 and the secondary coil 13 decreases, parasitic capacitance increases sharply. For example, when the distance between the primary coil 14 and the secondary coil 13 is 200 μm or less, the magnitude of the parasitic capacitance is 100 pF or greater. In a general slim-type transformer, when the magnitude of the parasitic capacitance is 100 pF or greater, performance deteriorates due to electrical coupling, for example, voltage increases at low power, insulation is damaged, and electromagnetic interference (EMI) characteristics deteriorate.

In order to reduce parasitic capacitance, the configuration of the secondary coil 13 may be modified from a conductive metal plate type to a conductive wire type. However, when the secondary coil is formed in a conductive wire type, a larger space for accommodating the secondary coil is required inside the cores 11 and 12, leading to an increase in the height of the transformer. Alternatively, in the case in which the thicknesses of the cores 11 and 12 are reduced in order to secure space for accommodating the secondary coil while maintaining the height of the transformer, magnetic flux density in the cores increases, leading to generation of a larger amount of heat.

DISCLOSURE

Technical Problem

A technical task of the present disclosure is to provide a slim-type transformer capable of being further miniaturized and a flat panel display device using the same.

Particularly, a technical task of the present disclosure is to provide a slim-type transformer capable of being miniaturized while securing leakage inductance and a flat panel display device using the same.

In addition, a technical task of the present disclosure is to provide a slim-type transformer capable of being miniaturized while reducing parasitic capacitance and a flat panel display device using the same.

The technical tasks of the present disclosure are not limited to the above-mentioned technical tasks, and other technical tasks not mentioned herein will be clearly understood by those skilled in the art from the following description.

Technical Solution

A transformer according to an embodiment may include a core unit having an upper core and a lower core, and a coil unit disposed in the core unit. The coil unit may include a first coil wound in a first direction, a second coil wound in a second direction, which is opposite the first direction, and a third coil having a flat plate shape. The lower core may include a body portion, first and second leg portions protruding from the body portion, and a spacing portion formed between the first leg portion and the second leg portion. The first leg portion may include two first outer legs and a first center leg disposed between the two first outer legs, and the second leg portion may include two second outer legs and a second center leg disposed between the two second outer legs. The first coil may be disposed to surround the first center leg, and the second coil may be disposed to surround the second center leg.

In an example, the second coil may be disposed on the first coil such that a portion of the second coil overlaps the first coil in the thickness direction.

In an example, the third coil may be disposed to surround the first center leg.

In an example, the first coil and the second coil may have ends led out toward a first side, and the third coil may have ends led out toward a second side, which is opposite the first side.

In an example, at least one of the first coil to the third coil may have a portion protruding outwards beyond the core unit.

In an example, the two first outer legs and the two second outer legs may be disposed parallel to each other on a plane, and the first center leg and the second center leg may be disposed parallel to each other on a plane.

In an example, the first leg portion may have a total planar area greater than the total planar area of the second leg portion.

In an example, the ratio of the planar areas of the two first outer legs to the planar area of the first center leg or the ratio of the planar areas of the two second outer legs to the planar area of the second center leg may be 0.65 to 0.8.

In an example, the ratio of the planar area of the second leg portion to the planar area of the core unit may be 0.04 to 0.08.

In an example, an insulating layer may be further disposed between the first coil and the second coil.

In an example, an insulating layer may be further disposed between the first coil and the third coil.

In an example, the transformer may further include a bobbin disposed in the core unit.

In an example, at least one of the upper core or the lower core may have a recess formed between the first center leg and the second center leg.

In an example, the transformer may further include a core shorting unit configured to electrically short the upper core and the lower core.

In addition, a circuit board according to an embodiment may include a substrate, a circuit portion formed on the substrate, and a transformer conductively connected to the circuit portion. The transformer may include a core unit having an upper core and a lower core, and a coil unit disposed in the core unit. The coil unit may include a first coil wound in a first direction, a second coil wound in a second direction, which is opposite the first direction, and a third coil having a flat plate shape. The upper core may include a body portion, first and second leg portions protruding from the body portion, and a spacing portion formed between the first leg portion and the second leg portion. The first leg portion may include two first outer legs and a first center leg disposed between the two first outer legs, and the second leg portion may include two second outer legs and a second center leg disposed between the two second outer legs. The first coil may be disposed to surround the first center leg, and the second coil may be disposed to surround the second center leg.

Advantageous Effects

A transformer according to an embodiment is provided therein with an inductor for securing leakage inductance through core sharing, and thus is capable of being reduced in size. Accordingly, a flat panel display device including the transformer is also capable of being slimmed.

In addition, according to the present disclosure, parasitic capacitance may be lowered by virtue of a core shorting unit for shorting one core and another core, thereby making it possible to inhibit deterioration in performance due to electrical coupling.

The effects achievable through the present disclosure are not limited to the above-mentioned effects, and other effects not mentioned herein will be clearly understood by those skilled in the art from the following description.

BEST MODE

Figure 1:
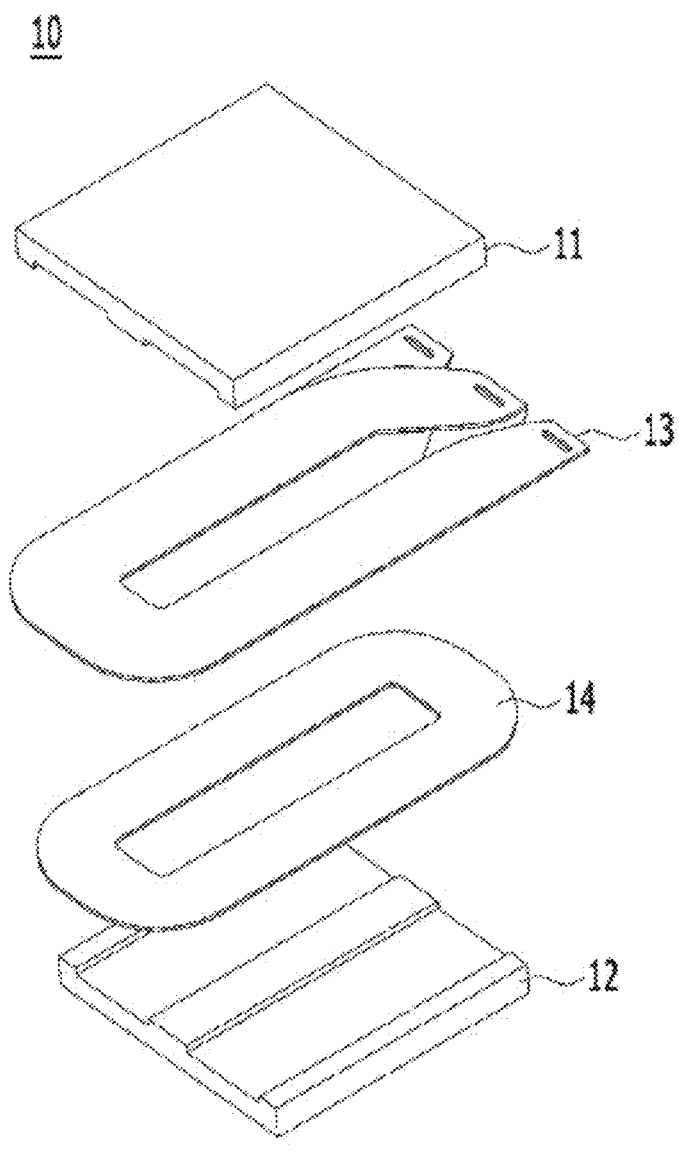
FIG. 1 is an exploded perspective view showing an example of the configuration of a general slim-type transformer.

The present disclosure will now be described more fully hereinafter with reference to the accompanying drawings, in which various embodiments are shown. The examples, however, may be embodied in many different forms and should not be construed as being limited to the embodiments set forth herein. It is to be understood that the present disclosure covers all modifications, equivalents, and alternatives falling within the scope and spirit of the present disclosure.

While ordinal numbers including "second", "first", etc. may be used to describe various components, they are not intended to limit the components. These expressions are used only to distinguish one component from another component. For example, a second element could be termed a first element, and, similarly, a first element could be termed a second element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

In the description of the embodiments, it will be understood that when an element, such as a layer (film), a region, a pattern or a structure, is referred to as being "on" or "under" another element, such as a substrate, a layer (film), a region, a pad or a pattern, the term "on" or "under" means that the element is "directly" on or under another element or is "indirectly" formed such that an intervening element may also be present. It will also be understood that criteria of on or under is on the basis of the drawing. In addition, the thickness or size of a layer (film), a region, a pattern or a structure shown in the drawings may be exaggerated, omitted or schematically drawn for the clarity and convenience of explanation, and may not accurately reflect the actual size.

The terminology used herein is for the purpose of describing particular embodiments only and is not intended to be limiting of exemplary embodiments of the disclosure. As used herein, the singular forms are intended to include the plural forms as well, unless the context clearly indicates otherwise. It will be further understood that the term "include" or "have", when used herein, specifies the presence of stated features, integers, steps, operations, elements, components, or combinations thereof, but do not preclude the presence or addition of one or more other features, integers, steps, operations, elements, components, or combinations thereof.

Unless otherwise defined, all terms used herein, which include technical or scientific terms, have the same meanings as those generally appreciated by those skilled in the art. The terms, such as ones defined in common dictionaries, should be interpreted as having the same meanings as terms in the context of pertinent technology, and should not be interpreted as having ideal or excessively formal meanings unless clearly defined in the specification.

Hereinafter, a transformer according to an embodiment will be described in detail with reference to the accompanying drawings.

Figure 3:
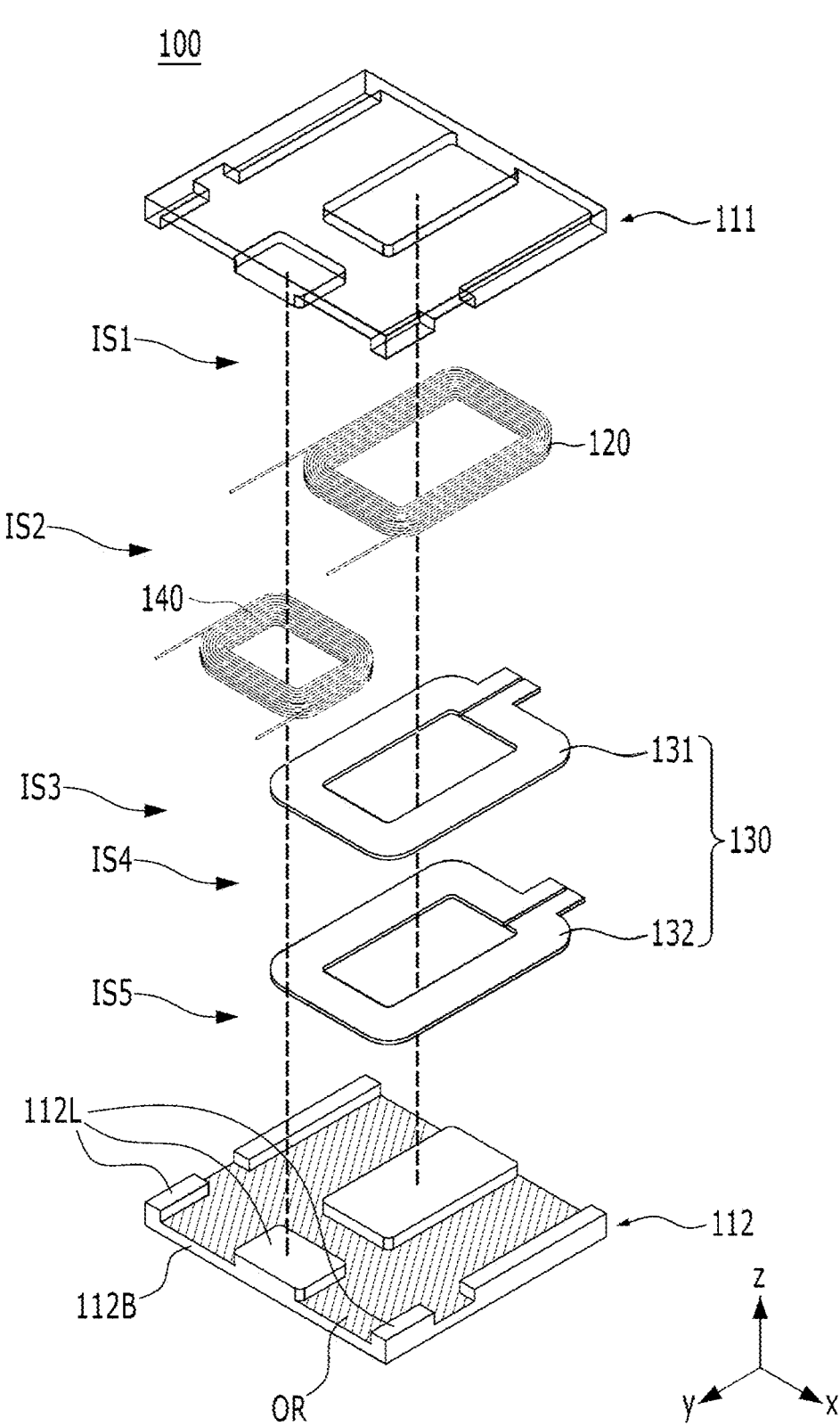
FIG. 3 is an exploded perspective view showing an example of the configuration of a transformer according to an embodiment.
Figure 4:
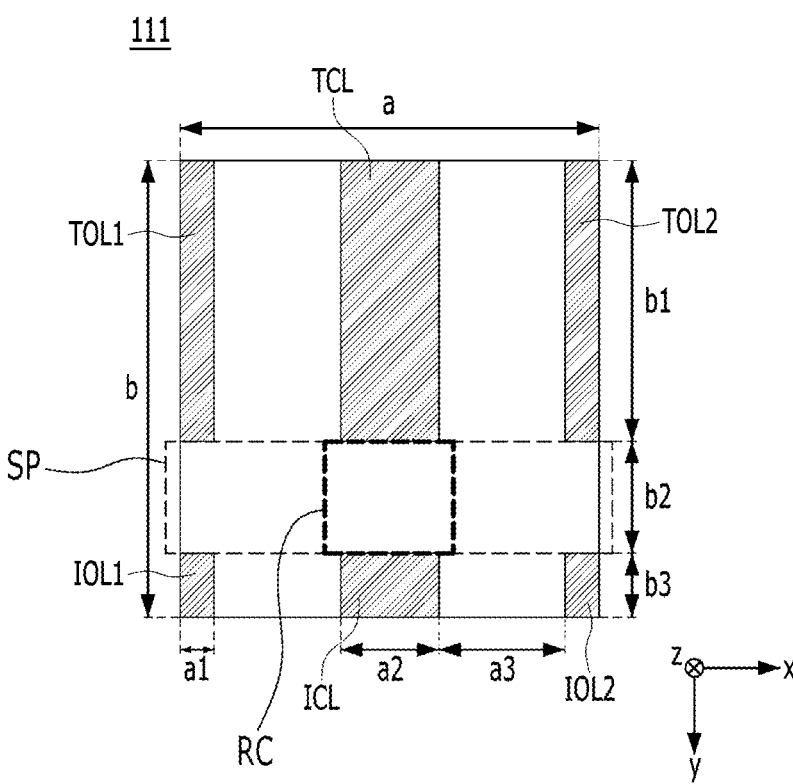
FIG. 4 shows an example of the configuration of a core according to an embodiment.

FIG. 3 is an exploded perspective view showing an example of the configuration of a transformer according to an embodiment, and FIG. 4 shows an example of the configuration of a core according to an embodiment.

For convenience of explanation, illustration of a bobbin is omitted from FIG. 3, and an example of the configuration of the bobbin will be described later with reference to FIG. 5.

Referring to FIGS. 3 and 4 together, a transformer 100 according to an embodiment may include cores 111 and 112 and coils 120, 130, and 140. The coils 120, 130, and 140 may include a primary coil 120, a secondary coil unit 130, and an inductor coil 140. Hereinafter, the respective components will be described in detail.

The cores 111 and 112 may have the function of a magnetic circuit, and may serve as a path for magnetic flux. The cores 111 and 112 may include an upper core 111, which is disposed at an upper position, and a lower core 112, which is disposed at a lower position. The two cores 111 and 112 may be formed to be symmetrical or asymmetrical to each other in a vertical direction. However, for convenience of explanation, the following description will be made on the assumption that the two cores are formed to be vertically symmetrical to each other, and thus only one of the two cores, e.g. the upper core 111, is illustrated in FIG. 4.

At least one of the upper core 111 or the lower core 112, which constitutes the cores 111 and 112, may include a body 112B, which has a flat plate shape, and a plurality of leg portions 112L, which protrude from the body in the thickness direction and extend in a predetermined direction. The plurality of leg portions may include first leg portions, which include two first outer legs TOL1 and TOL2, which extend in one axial direction (e.g. a y-axis direction) on a flat surface and are spaced apart from each other in another axis direction (e.g. an x-axis direction) thereon, and one first center leg TCL, which is disposed between the two first outer legs TOL1 and TOL2, and second leg portions, which include two second outer legs IOL1 and IOL2, which extend in one axial direction (e.g. the y-axis direction) and are spaced apart from each other in another axis direction (e.g. the x-axis direction), and one second center leg ICL, which is disposed between the two second outer legs. In this case, the first leg portions and the second leg portions may be spaced apart from each other, and thus gaps, i.e. spacing portions SP, may be formed therebetween.

Here, the first leg portions TOL1, TCL, and TOL2 mainly function as cores of the transformer, and the second leg portions IOL1, ICL, and IOL2 mainly function as cores of the inductor for securing leakage inductance. In other words, although each of the cores 111 and 112 according to an embodiment is implemented as having a single-body (i.e. integral-type) structure, the same performs the functions of cores of two magnetic elements, i.e. the transformer and the inductor. The above structure facilitates miniaturization of the transformer compared to a structure in which a core only for the transformer and a core only for the inductor are provided separately from each other.

The four outer legs TOL1, TOL2, IOL1, and IOL2 may have the same width a1, but the disclosure is not limited thereto. In an example, the widths of the first outer legs TOL1 and TOL2, which mainly function as the transformer, may be equal to each other, but may be different from the widths of the second outer legs IOL1 and IOL2, which mainly function as the inductor. In addition, the two center legs TCL and ICL may have the same width a2, but the disclosure is not limited thereto. In an example, the two center legs TCL and ICL may have different widths.

The first leg portions TOL1, TCL, and TOL2, which mainly function as cores of the transformer, and the second leg portions IOL1, ICL, and IOL2, which mainly function as cores of the inductor, may be spaced apart from each other by a predetermined distance b2 in one direction (the y-axis direction), and thus spacing portions may be formed between the two first outer legs TOL1 and TOL2 and the two second outer legs IOL1 and IOL2 and between the first center leg TCL and the second center leg ICL.

In this case, the spacing portions may serve as boundaries for inhibiting extension of the center legs and the outer legs in the y-axis direction and isolating a portion of the core that mainly functions as the inductor and a portion of the core that mainly functions as the transformer from each other.

Figure 6A:
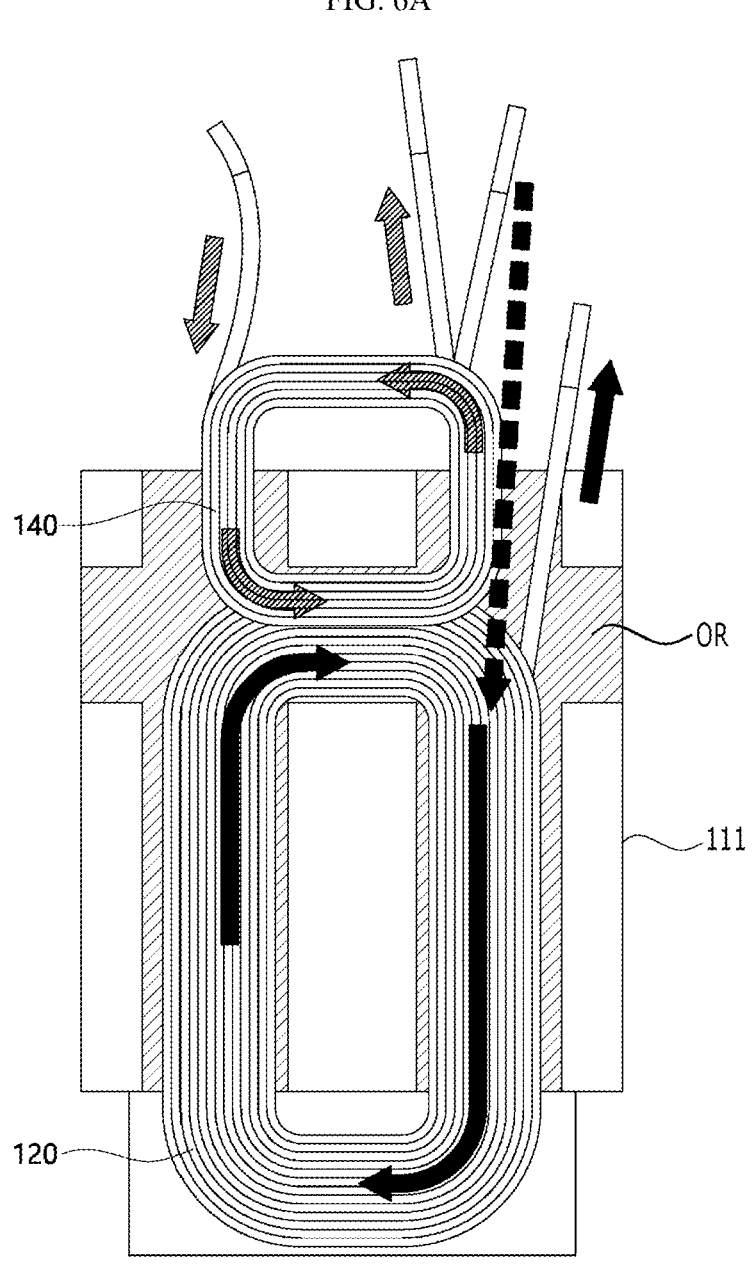
FIG. 6A is a view for explaining the winding direction of the transformer according to an embodiment.

Among the spacing portions, in the center-leg spacing portion formed between the first center leg TCL and the second center leg ICL, as shown in FIG. 6A, at least a portion of the primary coil 120 and at least a portion of the inductor coil 140 may overlap each other in the thickness direction (i.e. a z-axis direction). The structure in which the two coils 120 and 140 overlap each other may be a structure in which a larger accommodation space is required in the thickness direction in the center-leg spacing portion, and may also be a structure in which a larger amount of heat is generated due to addition of the heat produced from the superimposed coils 120 and 140. Therefore, in order to secure a coil accommodation space and to promote dissipation of heat, at least one of the upper core 111 or the lower core 112 may have a recess RC formed in the middle of the center-leg spacing portion thereof. Due to formation of the recess RC, the thickness of the corresponding portion of the core is reduced, and thus a space in which to dispose coils is secured. In addition, a path along which heat is transferred upwards in the upper core 111 is shortened, and a path along which heat is transferred downwards in the lower core 112 is shortened, whereby heat dissipation performance may be improved. Although the recess RC formed in the upper core 111 is illustrated in FIG. 4 as being recessed in the z-axis direction and having a rectangular planar shape, the disclosure is not limited thereto. Furthermore, it will be apparent to those skilled in the art that the recess may have any of various sizes.

Meanwhile, in the case of one of the cores 111 and 112, for example, the upper core 111 shown in FIG. 4, the ratio of the sum of the planar areas of the four outer legs TOL1, TOL2, IOL1, and IOL2 and the two center legs TCL and ICL to the overall planar area (i.e. a*b) of the upper core may be 0.15 to 0.30. Accordingly, the ratio of the planar area of the remaining region (hereinafter referred to as an "open region OR" or a "recess portion" for convenience of explanation), in which the outer legs or the center legs are not disposed, to the overall planar area of the upper core may be 0.7 to 0.85.

When the ratio of the planar areas of the outer legs and the center legs to the overall planar area increases, series inductance increases, and the magnetizing inductance of the transformer decreases. In contrast, when the ratio of the planar area of the open region OR to the overall planar area increases, series inductance decreases, and the magnetizing inductance of the transformer increases.

The ratio of the areas of the outer legs to the area of the center leg corresponds to a2:2*a1, which may be 0.65 to 0.8, but the disclosure is not limited thereto. The reason for this is that a magnetic path, which is formed by winding a wire, is mainly formed around the center legs.

In addition, the total planar area of the first leg portions TCL, TOL1, and TOL2 may be greater than the total planar area of the second leg portions ICL, IOL1, and IOL2.

In addition, the ratio of the planar area of the inductor portion, which mainly functions as the inductor, to the overall planar area of the core, i.e. b:b3, may be 0.04 to 0.08, but the disclosure is not limited thereto. When this area ratio increases, series inductance increases.

The area ratios described above are values obtained on the assumption that the turn ratio between the primary coil 120 and the inductor coil 140 is 1:1. However, it will be apparent to those skilled in the art that the turn ratio between the coils can be varied as appropriate.

When the upper core 111 and the lower core 112 are vertically coupled to each other, each of the four outer legs TOL1, TOL2, IOL1, and IOL2 and the two center legs TCL and ICL of the upper core 111 faces a corresponding one of the outer legs and the center legs of the lower core 112. In this case, a gap having a predetermined distance (e.g. 10 to 100 μm without being limited thereto) may be formed between at least one pair among the pairs of outer legs and the pairs of center legs, which face each other. In other words, when the upper core 111 and the lower core 112 are coupled to each other, two pairs of center legs and four pairs of outer legs may be formed, and thus a maximum of six gaps may be formed. Therefore, there is an advantage in that any of various specifications may be realized by controlling the positions at which the gaps are formed and the number of gaps. In an example, when gaps are formed at a total of four points, specifically, between the pair of center legs TCL, which mainly function as the transformer, between the pair of center legs ICL, which mainly function as the inductor, between the pair of outer legs IOL1, and between the pair of outer legs IOL2, it may be advantageous for maintenance of inductance variation. In another example, when all of the six gaps are formed, it may be advantageous from the aspect of heat generation characteristics because heat-generating portions are distributed to the maximum extent. Each gap may be formed in a manner such that a spacer, which has a predetermined thickness and is insulative, is interposed between the center legs or the outer legs that face each other, but the disclosure is not limited thereto.

Meanwhile, each of the cores 111 and 112 may include a magnetic material, for example, iron or ferrite, but the disclosure is not limited thereto.

The primary coil 120 may be wound around the center leg TCL that mainly functions as the transformer, and the inductor coil 140 may be wound around the center leg ICL that mainly functions as the inductor. Insulating layers (not shown) may be disposed on and under each of the coils 120 and 140 so that the coils 120 and 140 are insulated from the cores 111 and 112 and other coils 120, 130, and 140 adjacent thereto. The insulating layers may be disposed in regions ISI to IS5 of FIG. 3. The insulating layer may include at least one of ketone, a polyimide-based material, polyethylene terephthalate (PET), silicone, or an epoxy-based material, but the disclosure is not limited thereto.

Each of the primary coil 120 and the inductor coil 140 may be a multiple-turn winding in which a rigid metallic conductor, for example, a copper conductive wire, is wound multiple times in a spiral or planar spiral shape, but the disclosure is not limited thereto. For example, an enamel wire (USTC wire) wrapped by a fiber yarn, a Litz wire, a triple insulated wire (TIW), or the like may be used for each of the coils 120 and 140.

Four ends of the two conductive wires, each of which constitutes a corresponding one of the primary coil 120 and the inductor coil 140, may be led out in the same direction.

The secondary coil unit 130 may include a first plate 131 and a second plate 132, each of which has a flat plate shape. Each of the first plate 131 and the second plate 132 may include a conductive metal (e.g. copper or aluminum), and may have a planar shape that is bilaterally symmetrical to the other of the first plate 131 and the second plate 132, but the disclosure is not limited thereto. Each of the first plate 131 and the second plate 132 may be turned once around the center leg TCL, which mainly functions as the transformer. Preferably, the first plate 131 and the second plate 132 may be stacked, with the aforementioned insulating layer interposed therebetween. The space therebetween may correspond to IS4. The ends of the plates 131 and 132 may be led out in the same direction. In this case, the direction in which the ends of the plates 131 and 132 are led out may preferably be opposite the direction in which the four ends of the two conductive wires, each of which constitutes a corresponding one of the primary coil 120 and the inductor coil 140, are led out, but the disclosure is not limited thereto.

Meanwhile, a portion of at least one of the above-described coils 120, 130, and 140 may protrude outwards beyond the cores 111 and 112.

Figure 2A:
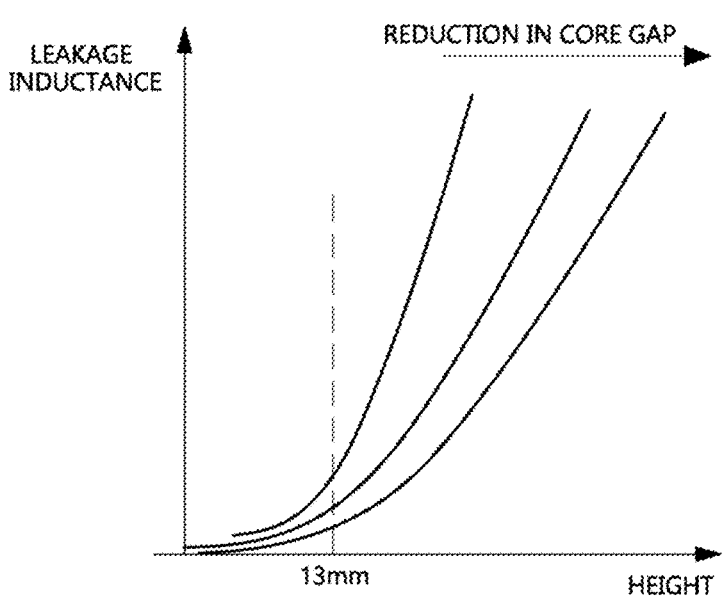
FIG. 2A shows the relationship between a change in the height of the slim-type transformer and leakage inductance.
Figure 2B:
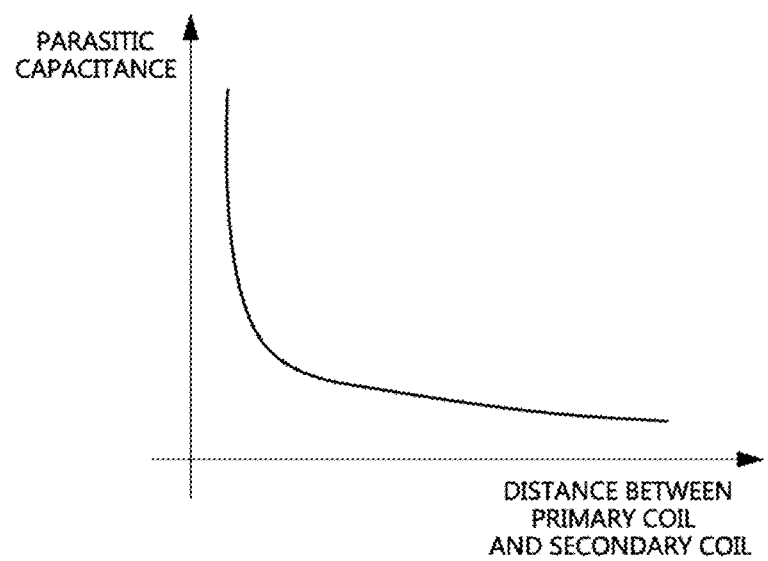
FIG. 2B shows the relationship between a change in the distance between a primary coil and a secondary coil and parasitic capacitance.
Figure 5:
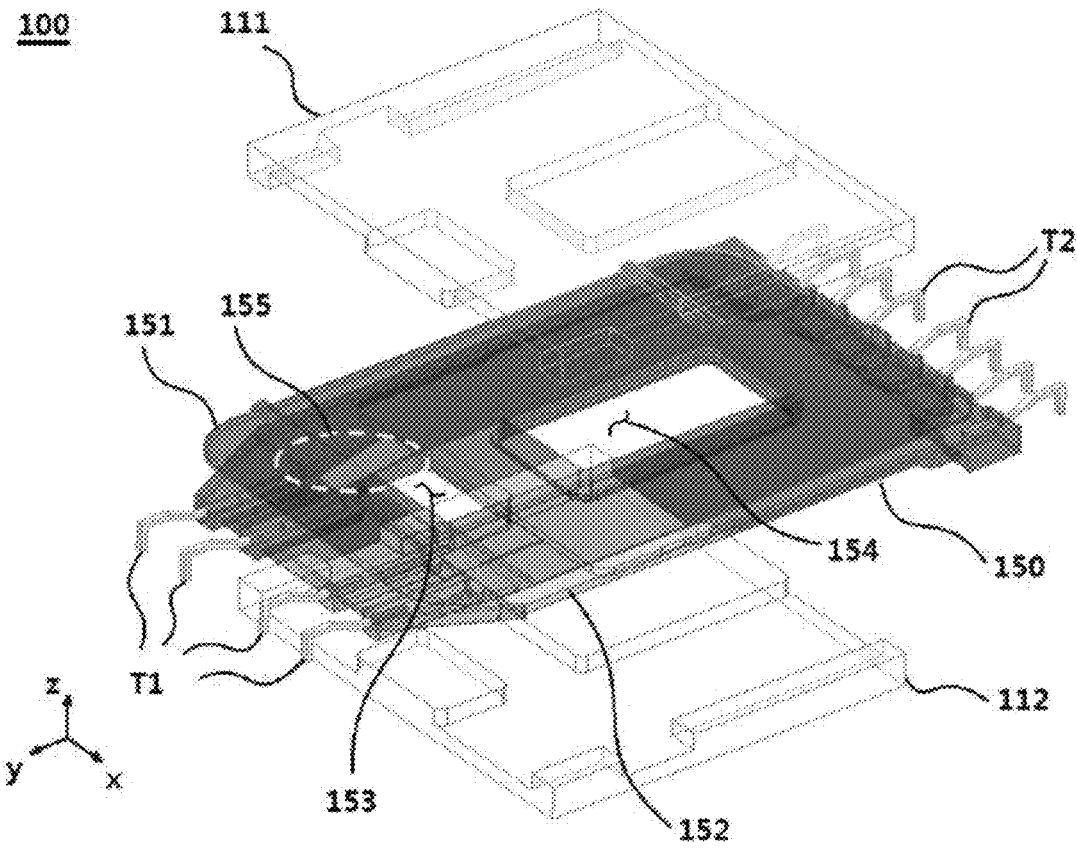
FIG. 5 shows an example of the shape of a bobbin according to an embodiment.

FIG. 5 shows an example of the shape of a bobbin according to an embodiment. Unlike FIG. 2, illustration of the primary coil 120, the secondary coil unit 130, and the inductor coil 140 is omitted from FIG. 5, and a bobbin 150 is additionally illustrated in FIG. 5.

Referring to FIG. 5, the bobbin 150 may be disposed between the upper core 111 and the lower core 112. The bobbin 150 may include an upper plate 151, a lower plate 152, a first bore 153, a second bore 154, a first terminal T1, and a second terminal T2.

The upper plate 151 and the lower plate 152 may be spaced apart from each other by a predetermined distance in the thickness direction (i.e. the z-axis direction), and the primary coil 120 and the inductor coil 140 may be wound and accommodated in this space. As described above, when the ends of the conductive wires, each of which constitutes a corresponding one of the primary coil 120 and the inductor coil 140, are led out in the same direction, each of the led-out ends may be conductively connected to a corresponding one of a plurality of individual terminals, which constitute the first terminal T1. Here, the lower plate 152 may be provided with a slope portion 155, which is disposed adjacent to the first bore 152 and forms passages inclined at a predetermined angle in order to guide the ends of the conductive wires constituting the primary coil 120 and the inductor coil 140 to the first terminal T1. By virtue of the slope portion 155, the ends of the conductive wires that are led out toward the first terminal T1 do not occupy the space between the upper plate 151 and the lower plate 152 in the thickness direction without a turn, whereby the number of windings may be increased.

The secondary coil unit 130 may be disposed on the bottom surface of the lower plate 152, and the ends of the first plate 131 and the second plate 132, which constitute the secondary coil unit 130, may be conductively connected to the second terminal T2. That is, by virtue of the lower plate 152, the secondary coil unit 130 is spaced apart from the primary coil 120 and the inductor coil 140 by a distance equal to at least the thickness of the lower plate 152, whereby sufficient distance for insulation is secured.

Each of the plurality of individual terminals, which constitute the first terminal T1 and the second terminal T2, may have a flange-type structure, in which the same extends at a predetermined slope to a predetermined height in a direction away from the center of the bobbin 150 and is then bent in the vertical direction. Due to this flange-type structure, the transformer 100 may be mounted in a bore formed in a substrate of the power supply unit (PSU), thereby reducing the influence of the height of the transformer 100 in the power supply unit (PSU), thus further contributing to the manufacture of a slimmer device. Here, the power supply unit (PSU) may include a circuit board, which includes a substrate and a circuit portion formed on the substrate, and the transformer 100 may be conductively connected to the circuit portion on the circuit board.

Meanwhile, the center leg ICL that mainly functions as the inductor of the cores 111 and 112 may pass through the first bore 153, and the center leg TCL that mainly functions as the transformer of the cores 111 and 112 may pass through the second bore 154.

Hereinafter, the winding directions of the first coil 120 and the inductor coil 140 will be described with reference to FIGS. 6A and 6B.

Figure 6B:
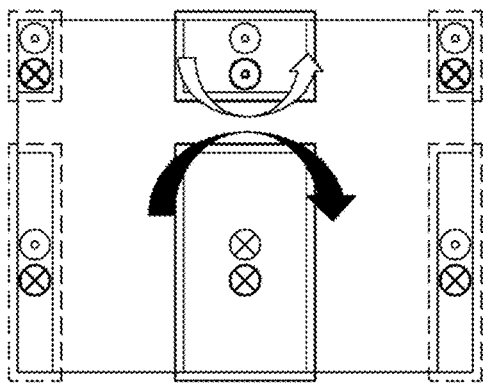
FIG. 6B is a view for explaining the effect of the winding direction of the transformer according to an embodiment.
Figure 6B:
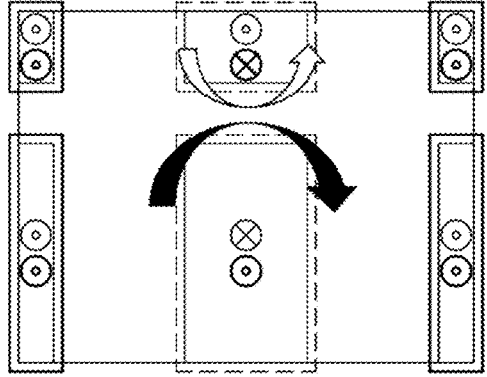
Figure 6B:
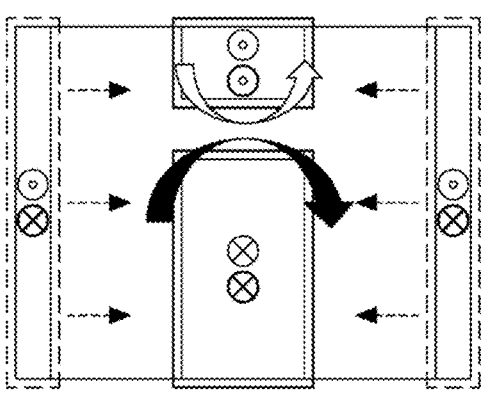
Figure 6B:
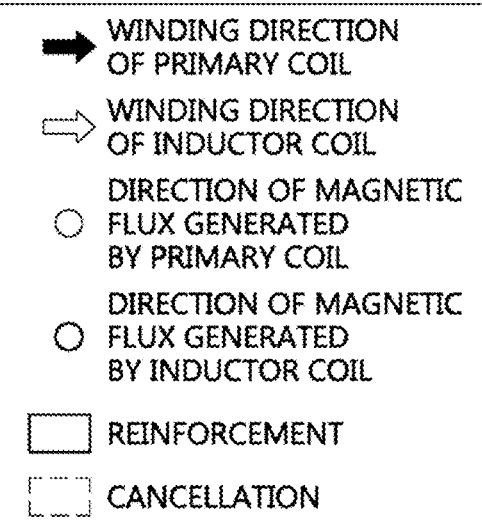

FIG. 6A is a view for explaining the winding direction of the transformer according to an embodiment, and FIG. 6B is a view for explaining the effect of the winding direction of the transformer according to an embodiment.

First, referring to FIG. 6A, the primary coil 120 and the inductor coil 140 according to the embodiment may be wound in opposite directions. In an example, the primary coil 120 may be wound in the clockwise direction, and the inductor coil 140 may be wound in the counterclockwise direction. Of course, this is illustrative. The primary coil 120 may be wound in the counterclockwise direction, and the inductor coil 140 may be wound in the clockwise direction. The reason why the winding directions of the primary coil 120 and the inductor coil 140 are opposite each other will be described with reference to FIG. 6B.

First, referring to the uppermost drawing in FIG. 6B, when the primary coil 120 is wound in the clockwise direction and the inductor coil 140 is wound in the counterclockwise direction, the direction of the magnetic flux generated by the primary coil 120 and the direction of the magnetic flux generated by the inductor coil 140 are the same in each of the center legs, thus resulting in magnetic flux reinforcement. On the other hand, the direction of the magnetic flux generated by the primary coil 120 and the direction of the magnetic flux generated by the inductor coil 140 are opposite each other in each of the outer legs, thus resulting in magnetic flux cancellation. According to experimentation performed under the above conditions, inductance of 4100 pH was generated when each of the primary coil 120 and the inductor coil 140 was wound thirteen turns, and inductance of 3610 pH was generated when each of the primary coil 120 and the inductor coil 140 was wound twelve turns.

On the other hand, referring to the intermediate drawing in FIG. 6B, when the winding direction of the primary coil 120 and the winding direction of the inductor coil 140 are the same, magnetic flux cancellation occurs in each of the center legs, and magnetic flux reinforcement occurs in each of the outer legs, unlike the case in FIG. 6A. According to experimentation performed under the above conditions, inductance of 1946 pH was generated when each of the primary coil 120 and the inductor coil 140 was wound thirteen turns, and inductance of 1706 pH was generated when each of the primary coil 120 and the inductor coil 140 was wound twelve turns. That is, compared to the case in FIG. 6A, in which the winding directions are opposite each other, inductance decreased remarkably. Consequently, it can be seen that it is preferable for the winding direction of the primary coil 120 and the winding direction of the inductor coil 140 to be opposite each other in order to obtain a high leakage inductance value.

Meanwhile, referring to the lowermost drawing in FIG. 6B, when the outer legs are formed in an integral type, although the winding direction of the primary coil 120 and the winding direction of the inductor coil 140 are opposite each other, magnetic flux cancellation occurring in each of the outer legs has an effect on each of the center legs, thus degrading the reinforcement characteristics in each of the center legs. This case results not only in a decrease in leakage inductance value but also in an increase in the amount of heat that is generated. Therefore, it is preferable to form the spacing portions in order to avoid integration of the outer legs.

According to an embodiment of the present disclosure, a heat dissipation unit may be disposed on each of the cores 111 and 112 in order to improve heat dissipation performance. This will be described with reference to FIG. 7.

Figure 7:
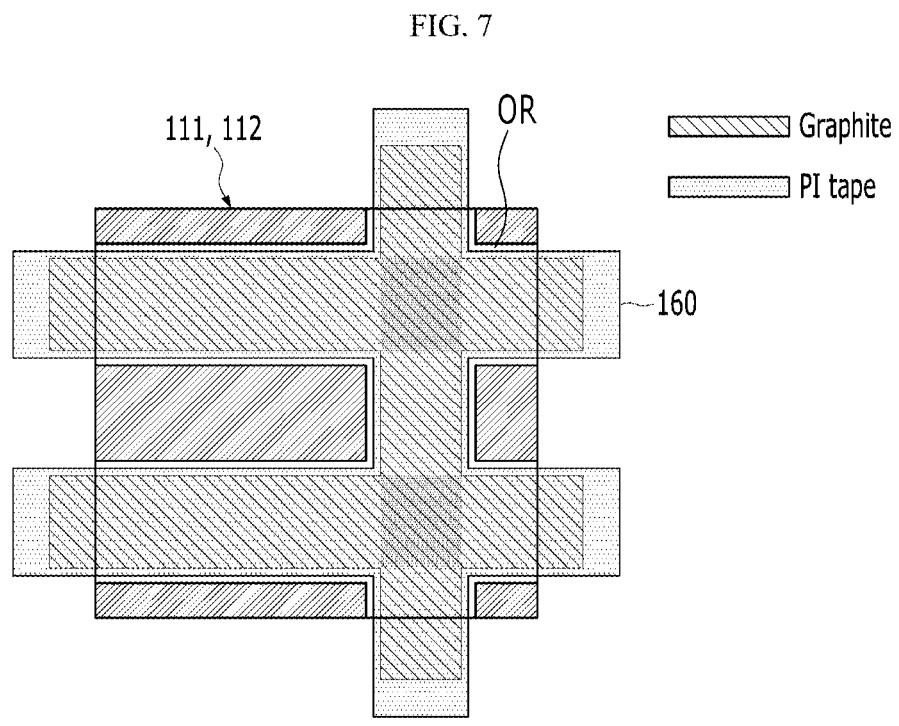
FIG. 7 is a view for explaining a heat dissipation unit of the transformer according to an embodiment.

FIG. 7 is a view for explaining a heat dissipation unit of the transformer according to an embodiment.

Referring to FIG. 7, a heat dissipation unit 160 may be disposed in the open region OR of at least one of the upper core 111 or the lower core 112, which constitutes the cores 111 and 112, for example, the open region OR of the lower surface of the upper core 111 and/or the open region OR of the upper surface of the lower core 112. The heat dissipation unit 160 may be formed in the shape of a film that includes a material having excellent heat resistance and heat conductivity, for example, at least one of graphite or a sheet of polyimide (PI) (Kapton) tape, but the disclosure is not limited thereto. The heat dissipation unit 160 may extend to the outside of each of the cores 111 and 112 so as to be in contact with a housing of the power supply unit (PSU) or a heat sink, thereby contributing to rapid dissipation of the heat generated inside the transformer 100.

On the other hand, according to another embodiment, the transformer may further include a core shorting unit (not shown) in order to control parasitic capacitance, which increases as the vertical distance between the primary coil 120 and the secondary coil unit 130 decreases. The core shorting unit may be disposed on one or both of the surfaces of the cores 111 and 112 that face each other, and may function to electrically short the upper core 111 and the lower core 112. In order to realize a short circuit, at least a portion of the core shorting unit may be in contact with (that is, conductively connected to) the upper core 111, and at least part of the remaining portion thereof, other than the portion contacting the upper core 111, may be in contact with the lower core 112. Furthermore, the core shorting unit may include a conductive material in order to short the upper core 111 and the lower core 112, and may take the form of a thin film in order to make the transformer slim, but the disclosure is not limited thereto. In an example, the core shorting unit may be a copper foil, or may take the form of a conductive wire having a circular-shaped or polygonal-shaped cross-section. In another example, the core shorting unit may take the form of a thin film having a planar shape that is polygonal, other than rectangular, or circular.

While the present disclosure has been particularly shown and described with reference to exemplary embodiments thereof, these embodiments are only proposed for illustrative purposes and do not restrict the present disclosure, and it will be apparent to those skilled in the art that various changes in form and detail may be made without departing from the essential characteristics of the embodiments set forth herein. For example, respective configurations set forth in the embodiments may be modified and applied. Further, differences in such modifications and applications should be construed as falling within the scope of the present disclosure as defined by the appended claims.

The invention claimed is:

1. A transformer comprising:
a core unit having an upper core and a lower core; and
a coil unit disposed in the core unit,
wherein the coil unit comprises:
a first coil wound in a first direction;
a second coil wound in a second direction, the second direction being opposite the first direction; and
a third coil having a flat plate shape,
wherein the upper core comprises:
a body portion;
a first leg portion and a second leg portion protruding from the body portion; and
a spacing portion formed between the first leg portion and the second leg portion,
wherein the first leg portion comprises two first outer legs and a first center leg disposed between the two first outer legs,
wherein the second leg portion comprises two second outer legs and a second center leg disposed between the two second outer legs,
wherein the first coil is disposed to surround only the first center leg,
wherein the second coil is disposed to surround only the second center leg,
wherein the second coil is disposed on the first coil such that a portion of the second coil overlaps the first coil in a thickness direction, and
wherein the first leg portion has a total planar area greater than a total planar area of the second leg portion.

2. The transformer according to claim 1, comprising:
an insulating layer disposed between the first coil and the third coil.

3. The transformer according to claim 1, comprising:
an insulating layer disposed between the first coil and the third coil.

4. The transformer according to claim 1, wherein at least one of the first coil to
the third coil has a portion protruding outwards beyond the core unit.

5. The transformer according to claim 1, wherein the two first outer legs are disposed in parallel to each other and the two second outer legs are disposed in parallel to each other in plan view, and
wherein the first center leg and the second center leg are disposed in parallel to each other in plan view.

6. The transformer according to claim 5, wherein a ratio of a sum of planar areas of the two first outer legs to a planar area of the first center leg or a ratio of a sum of planar areas of the two second outer legs to a planar area of the second center leg is between 0.65 and 0.8.

7. The transformer according to claim 1, wherein a ratio of a length of the second leg portion in a third direction to a length of the core unit in the third direction is between 0.04 and 0.08, and
wherein the third direction is a direction in which the second leg portion extends.

8. The transformer according to claim 1, wherein at least one of the upper core or the lower core has a recess formed between the first center leg and the second center leg.

9. The transformer according to claim 1, comprising:
a bobbin disposed in the core unit.

10. The transformer according to claim 1, wherein the third coil is formed such that a plurality of conductive metal plates having planar shapes bilaterally symmetrical to each other are stacked on each other.

11. The transformer according to claim 1, comprising:
a heat dissipation unit disposed in an open region of at least one of the upper core or the lower core,
wherein the opening region is a remaining planar region, relative to an overall planar area of the upper core or the lower core, in which outer legs or center legs are not disposed.

12. The transformer according to claim 11, wherein the heat dissipation unit extends outside the core unit.

13. A transformer comprising:
a core unit having an upper core and a lower core; and
a coil unit disposed in the core unit,
wherein the coil unit comprises:
a first coil wound in a first direction;
a second coil wound in a second direction, the second direction being opposite the first direction; and
a third coil having a flat plate shape,
wherein the upper core comprises:
a body portion;
a first leg portion and a second leg portion protruding from the body portion; and
a spacing portion formed between the first leg portion and the second leg portion,
wherein the first leg portion comprises two first outer legs and a first center leg disposed between the two first outer legs,
wherein the second leg portion comprises two second outer legs and a second center leg disposed between the two second outer legs,
wherein the first coil is disposed to surround only the first center leg, wherein the second coil is disposed to surround only the second center leg, wherein the second coil is disposed on the first coil such that a portion of the second coil overlaps the first coil in a thickness direction, wherein the third coil is disposed to surround only the first center leg.

14. A transformer comprising:

a core unit having an upper core and a lower core; and a coil unit disposed in the core unit, wherein the coil unit comprises:

a first coil wound in a first direction;

a second coil wound in a second direction, the second direction being opposite the first direction; and a third coil having a flat plate shape, wherein the upper core comprises:

a body portion;

a first leg portion and a second leg portion protruding from the body portion; and a spacing portion formed between the first leg portion and the second leg portion, wherein the first leg portion comprises two first outer legs and a first center leg disposed between the two first outer legs, wherein the second leg portion comprises two second outer legs and a second center leg disposed between the two second outer legs, wherein the first coil is disposed to surround only the first center leg, wherein the second coil is disposed to surround only the second center leg, wherein the second coil is disposed on the first coil such that a portion of the second coil overlaps the first coil in a thickness direction, wherein the first coil and the second coil have ends led out toward a first side, and wherein the third coil has ends led out toward a second side, the second side being opposite the first side.

* * * * *